United States Patent [19]

Okamoto et al.

[11] Patent Number: 4,994,932

[45] Date of Patent: Feb. 19, 1991

[54] SUPERCONDUCTING CURRENT LIMITING APPARATUS

[75] Inventors: Masaru Okamoto, Kawasaki; Hitoshi Mizoguchi, Yokohama; Masayuki Ishikawa, Kawasaki; Hisatoshi Ikeda, Zushi; Katsumi Suzuki; Susumu Nishiwaki, both of Yokohama; Tsuneharu Teranishi, Kawasaki; Satoru Yanabu; Tsutomu Fujioka, Machida, all of Japan

[73] Assignee: Kabushiki Kaisha Toshiba, Kawasaki, Japan

[21] Appl. No.: 471,697

[22] Filed: Jan. 26, 1990

Related U.S. Application Data

[63] Continuation of Ser. No. 269,066, Nov. 9, 1988, abandoned.

[30] Foreign Application Priority Data

| Nov. 9, 1987 | [JP] | Japan | 62-281003 |
| Dec. 16, 1987 | [JP] | Japan | 62-316159 |
| Jan. 26, 1988 | [JP] | Japan | 63-13523 |
| Feb. 19, 1988 | [JP] | Japan | 63-35150 |
| May 6, 1988 | [JP] | Japan | 63-109129 |
| May 6, 1988 | [JP] | Japan | 63-109130 |

[51] Int. Cl.$^5$ .............................................. H02H 9/02
[52] U.S. Cl. ........................................ 361/19; 361/58; 361/93; 323/360; 338/325; 505/850; 505/881
[58] Field of Search ............... 361/19, 43, 58, 93, 361/103, 104, 111, 141, 385; 323/360, 908, 304; 338/325; 505/850, 869, 881, 885, 891, 899; 174/15.4; 357/82, 83

[56] References Cited

U.S. PATENT DOCUMENTS

| 3,529,210 | 9/1970 | Toshio et al. ........................... 361/58 |
| 3,691,491 | 9/1972 | Massar et al. ...................... 361/58 X |
| 3,715,703 | 2/1973 | Croso et al. ........................... 338/325 |
| 4,459,495 | 7/1984 | Gheewah ......................... 323/360 X |

OTHER PUBLICATIONS

Rideout, Close-cycle liquid nitrogen refrigeration system for low-temperature computer operation, IBM Technical Disclosure Bulletin, vol. 18, No. 4, pp. 1226-1229 Sep. 1975.

"Superconducting Fault Current Limiter", Section 12, K. E. Gray and D. E. Fowler, EPRI EL-276-SR Special Report, Apr. 1977.

*Primary Examiner*—Todd E. Deboer
*Attorney, Agent, or Firm*—Oblon, Spivak, McClelland, Maier & Neustadt

[57] ABSTRACT

A superconducting current limiting apparatus includes a first container, a superconducting current limiting element accommodated in the first container, a refrigerant filling the first container for cooling the superconducting current limiting element accommodated in the first container, a second container for accommodating the first container in such a manner that the first container is heat insulated, and a conductor for connecting the superconducting current limiting element to an external power supply system. Such a superconducting current limiting apparatus can be used to limit a short-circuit current. It can be incorporated in a short circuit controlling superconducting system.

16 Claims, 8 Drawing Sheets

SUPERCONDUCTING CURRENT LIMITING APPARATUS

This application is a continuation of application Ser. No. 269,066, filed on Nov. 9, 1988, now abandoned.

BACKGROUND OF THE INVENTION

1. Field of the Invention

The present invention relates to a superconducting current limiting apparatus which employs a superconductor, and, more particularly, to a superconducting current limiting apparatus which is capable of limiting the flow of short circuit current which an electric power system delivers when a short circuit is established so as to lower the level at which the components of the power system are required to withstand short-circuit currents. Furthermore, the present invention relates to a superconducting current limiting apparatus which employs as a current limiting element a superconductor which exhibits superconductivity at a temperature above the boiling point of liquid nitrogen.

2. Description of the Related Art

With the steady increase in the demand for electric power which we have seen in recent years, the level of short-circuit current which a power transmission or transformation system delivers when a short circuit is established in it is gradually rising. This rise in the voltage of short-circuit current represents a threat to the components of the electric power system, as well as to circuit breakers adapted to interrupt the flow of this short-circuit current, and, hence, there has been a demand for the development of a current limiting apparatus which is capable of limiting the flow of short-circuit current. This is in line with the demand for a current limiting apparatus which is capable of limiting current flow immediately so that currently used components of a power supply or transmission lines can continue to be used without replacement and also so that manufactured components or transmission lines can be designed to have a low short-circuit current capacity.

Further, the level of short-circuit current which flows in household distribution systems is also rising, and a demand has arisen for a high quality power supply which does not suffer from instantaneous power failures, just like the one supplied to electronic calculators that have grown in popularity. In household distribution systems, a protective device for limiting the current such as a fuse may be used in a case wherein there is no need for specifying any abnormally connected points in a circuit and providing for selective breaking of the circuit. However, such a fuse must be replaced to restore power each time a short-circuit occurs, even when instantaneous short-circuiting caused by such events as lightning is the cause. This means that the power supply is frequently interrupted for a long period of time, and is therefore undesirable from the viewpoint of ensuring a stable power supply. Such a prolonged interruption of service is not permissible in a power supply system. No currently available current limiting apparatus is capable of limiting current flow and of speedily restoring power to normal when the detrimental excess current has been eliminated, and hence, current limiting apparatuses have not been used in power supply systems.

Research has been conducted on current limiting apparatuses in the United States of America for many years, and various reports have been issued so far. Among them is the EL-276-SR Special Report for the Electric Research Institute (EPRI): Symposium Proceedings, "New Concepts in Fault Current limiters and Power Circuit Breakers". The basic requirements of a current limiting apparatus are to increase impedance at the time of an abnormal connection between two points of a circuit and to limit the flow of a short-circuit current. Various current limiting apparatuses which fulfill this function have been proposed. However, only current limiting apparatuses with a fuse are practical from the viewpoint of stabililty of operation and the ability to restore power supply. This type of current limiting apparatus is disclosed, for example, in the specifications of Japanese Patent Laid-Open Nos. 56-57236 and 47-40146. These current limiting apparatuses with a fuse utilize changes in the state of metal of alkali type. However, this type of current limiting apparatus has the disadvantage that it is difficult to develop a large voltage drop, and use thereof is therefore limited to limitation of low voltages of up to several thousands volts.

Research on current limiting apparatuses which utilize superconductors have also been conducted. However, a conventional current limiting apparatus employing liquid helium involves the problem that it is difficult to radiate the heat generated in a normal conducting state, and these have not yet been put into practical use.

Recently, high-temperature superconducting materials have been developed rapidly, and materials which exhibit superconductivity at a temperature beyond the liquid nitrogen boiling point of 77 K have been developed. Such superconductive materials include a ceramic formed of Y-Ba-Cu-O compounds.

Superconducting current limiting apparatuses limit the flow of a short-circuit current utilizing an increase in an electrical resistance which occurs after the superconducting material has been rendered to a normal conducting state (after it has quenched). In order to suppress the rise in a temperature which occurs when the material quenches, superconducting materials which are employed in the current limiting apparstus must have a relatively low current density and a large cross-sectional area. Further, it must be elongated in order to obtain a large resistance. Use of such a superconducting material may allow a resultant current limiting apparatus to be used even when it generates a large amount of heat after the current density of the material has exceeded a critical current density Jc and the superconducting material has been rendered to a normal conducting state. This is because, when compared with a conventional current limiting apparatus employing a superconducting material which exhibits a superconductivity at a temperature of the boiling point of liquid helium, a current limiting apparatus employing the above-described superconducting material can be used at a higher temperature and therefore has a higher specific heat and because it has a critical temperature higher than the boiling point of liquid nitrogen, and therefore has a larger heat capacity.

Current limiting apparatuses which employ a superconducting wire so as to limit the flow of a short-circuit current utilizing a rise in the electrical resistance which occurs when the superconducting wire quenches have been proposed.

In such an apparatus, the superconducting wire produces Joule heat once it has been rendered to a normal state, and the heated superconducting wire must be therefore cooled by a refrigerant to restore a superconducting state and the refrigerant must be poured to a predetermined level. These operations normally take a time ranging between several tens minutes to a few hours, and the line cannot be used during that time. Normally, in a power supply system, power must be restored 0.3 to 0.5 seconds after the current flow has been interrupted so as to avoid occurrence of a power failure. In the case wherein a relay system for specifying abnormally connected points and for interrupting the flow of a current in the required portion of a circuit is used, since it takes about 2 seconds for the relay system to start operation, the short-circuit current is made to flow during that time (short-time duty). Thereafter, the superconducting wire must be returned to a superconducting state from a normal state in 0.2 seconds since the power must be restored (speedy closing of a circuit) 0.2 seconds after the flow of the short-circuit current has been interrupted. In other words, the superconducting wire which has been heated by Joule heat as a resistor for 2 seconds must be cooled to a superconducting transition temperature (a critical temperature) 0.2 seconds after the flow of the current has been interrupted.

Thus, in order to maintain a superconducting current limiting element to a superconducting state, provision of an effective cooling means for maintaining the temperature of the element below a superconducting transition temperature is essential.

SUMMARY OF THE INVENTION

In view of the above-described problems of a conventional current limiting apparatus, an object of the present invention is to provide a superconducting current limiting apparatus which is small and which is not subjected to the effect of a magnetic field.

Another object of the present invention is to provide a superconducting current limiting apparatus in which the entirety of a superconducting current limiting wire is brought into contact with a refrigerant which is cooled to a temperature below the critical temperature of the superconducting current limiting wire so as to stabilize the superconducting characteristics of the superconducting current limiting wire.

Another object of the present invention is to provide a superconducting current limiting apparatus which enables the a superconducting current limiting element to be cooled effectively and which ensures short-time duty and speedy closing of a circuit.

Another object of the present invention is to provide a short-circuit current limiting apparatus which employs the superconducting current limiting apparatus which attains the above-described objects of the present invention so as to ensure a speedy closing of a circuit.

In order to achieve the above-described and other objects, the present invention provides a superconducting current limiting apparatus which is characterized by the inclusion of a first container, a superconducting current limiting element accommodated in the first container, a refrigerant filling the first container so as to cool the superconducting current limiting element, a second container for accommodating the first container in such a manner that the first container is heat insulated by the second container, and a conductor for connecting the superconducting current limiting element to an external power supply system.

According to a preferred form of the invention, the superconducting current limiting element comprises a stack of stack elements each of which accommodates a current limiting wire, the stack elements being laid one on top of the other with sufficient intervals being provided between adjacent stack elements to serve as passageways for the refrigerant.

According to another preferred form of the invention, the superconducting current limiting element includes a plurality of coaxially disposed insulating tubes, a superconducting current limiting wire being wound around each of the insulating tubes in such a manner that the magnetic fluxes generated by currents that flow in the wires cancel each other.

According to another preferred form of the invention, the refrigerant comprises a gas having a temperature which is below the critical temperature of the superconducting current limiting element, the gas being able to be used together with liquid nitrogen.

The present invention also provides a short circuit current limiting superconducting system which is characterized by the inclusion of a plurality of superconducting units having different critical current values, a circuit breaker connected in series with the superconducting units, and a closing device parallel-connected to the units in the plurality of superconducting units other than the unit having the maximum critical current value.

In the present invention, a small superconducting current limiting element which is in a non-inductive state is disposed in a container. The superconducting current limiting element is cooled by a refrigerant having a temperature below the critical temperature of the superconducting current limiting element, which is brought into contact with the large area of the current limiting element. Further, in order to improve the heat insulating effect of the container, the container is placed in an external container which is evacuated. In consequence, the overall size of the superconducting current limiting apparatus can be reduced, and the superconducting current limiting element provided in the container can be cooled sufficiently and effectively. As a result, the superconducting characteristics of the current limiting element can be maintained stable when a current is made to flow in a circuit or a system which employs the current limiting apparatus. Further, rise in the temperature of the current limiting element which is in operation can be suppressed, and short-time duty and speedy closing of a circuit can be ensured, enabling the power to be restored quickly after a short-circuit current has been removed. This in turn enables a current limiting apparatus to be used in a power transmission system so as to ensure provision of a high quality power supply.

The above-described preferred forms of the present invention will become apparent from the description in the specification which is taken in conjunction with the accompanying drawings.

DESCRIPTION OF THE PREFERRED EMBODIMENTS

A first embodiment of the present invention will be described below with reference to FIG. 1. A current limiting element 5 is accommodated in a tank 6 filled with liquid nitrogen N. The current limiting element is composed of insulating stack elements 1 on each of which a current limiting wire is mounted in non-inductive fashion, end plates 3 for fixing a large number of stack elements which are piled one on top of the other, and an insulating supporting stud 4. The stud 4 is fixed to the interior of the tank 6 by means of insulating supporting members. The tank 6 is disposed within an external container 7. The space between the tank 6 and the container 7 may be evacuated or be filled with a highly insulating material so as to enhance the heat insulation effect of the internal tank 6.

A cooling device 11 for cooling the liquid nitrogen N in the internal tank is mounted on the container 7.

Figure 1:
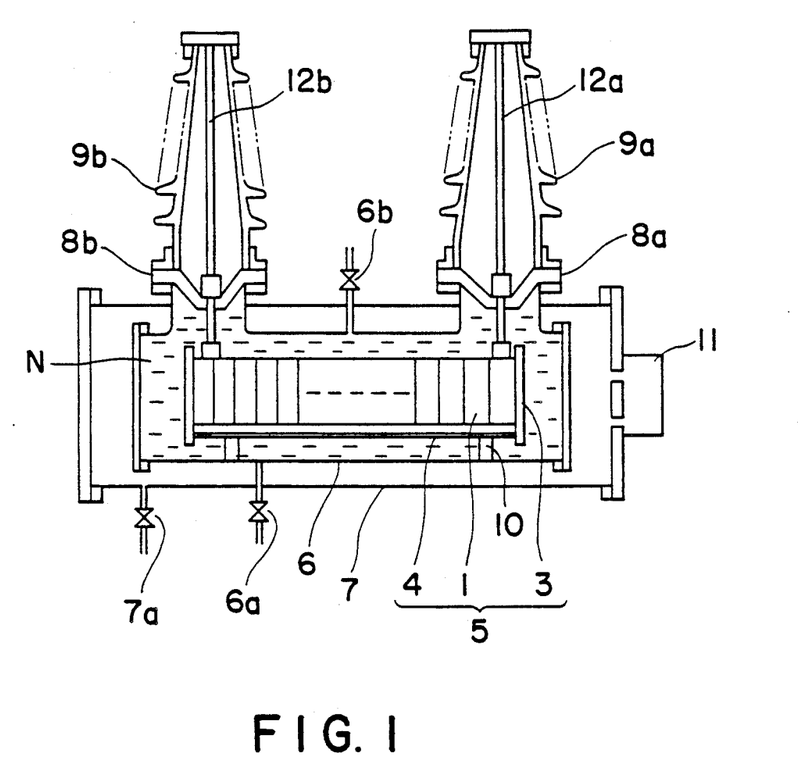
FIG. 1 is a longitudinal cross-sectional view of a superconducting current limiting apparatus, showing a first embodiment of the present invention.

In the example shown in FIG. 1, the space between the tank 6 and the container 7 is made into a vacuum. In order to make this possible, a valve 7a through which the air in the space may be evacuated is provided. The tank 6 is provided with a supply valve 6a through which liquid nitrogen is supplied to the tank, as well as a discharge valve 6b through which liquid nitrogen is discharged.

Further, the openings in the tank 6 are closed by insulating spacers 8a and 8b. Conductors 12a and 12b pass through the centers of the insulating spacers 8a and 8b, respectively, and then extend to the stack elements 1 so as to connect the superconducting current limiting element 5 to an external system. The conductors 12a and 12b are protected by bushings 9a and 9b, respectively.

Figure 2:
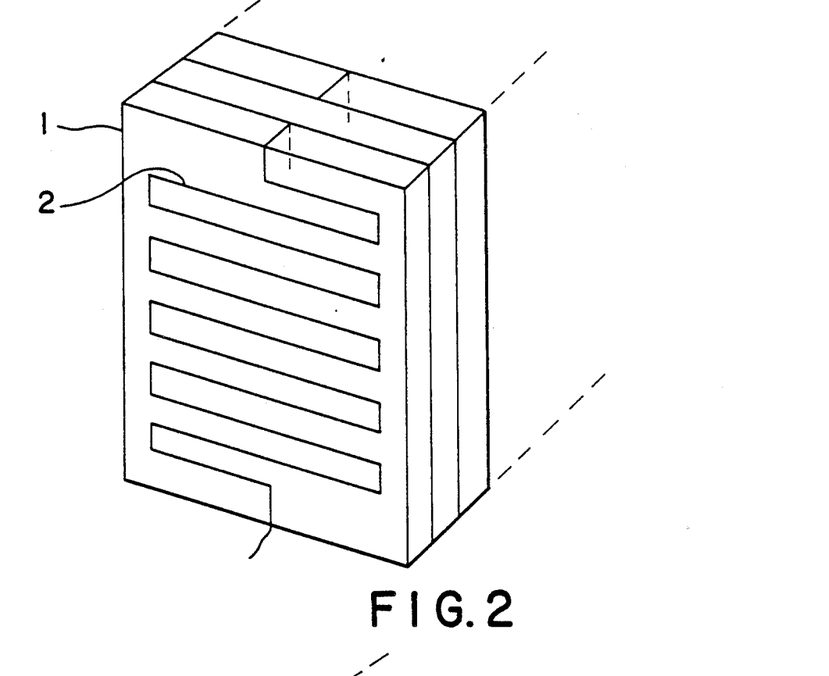
FIG. 2 is a perspective view of a stack element which forms a superconducting current limiting element of the superconducting current limiting apparatus of FIG. 1.

Turning to FIG. 2, which shows in detail the stack element 1 which forms the current limiting element 5, a superconducting current limiting wire 2 made of a superconductor which exhibits superconductivity at the boiling point of liquid nitrogen (77 K) is mounted on each of the stack elements 1. In order to attain an electromagnetic non-inductive state, the current limiting wire 2 is made to run in parallel lines in which current flows in opposite directions in adjacent lines.

The large number of stack elements 1 with the superconducting current limiting wire are laid one on top of the other to form a compact current limiting element 5.

In the thus-arranged current limiting apparatus, the current limiting element is normally in a superconducting state. However, once a short-circuit is established and the current that flows in the current limiting element exceeds the critical current value thereof, the current limiting element quenches and becomes a resistor, by which the flow of short-circuit current is limited. As the superconductor quenches and becomes a resistor, the temperature thereof rises due to heat generated in the resistor. In a power supply system, since the output voltage must be quickly restored to normal when the short-circuit current has been removed, the current limiting element which has become a resistor must be quickly returned to a superconducting state. This is achieved by cooling the current limiting element which has been heated to a temperature above the critical temperature using a refrigerant which is made to flow into the gaps between the stack elements. From this viewpoint, the example shown in FIG. 1 may not be very effective in cooling the superconducting current limiter because the stack elements 1 are disposed very close to each other and the liquid nitrogen N cannot therefore be brought into direct contact with the superconducting current limiting wires 2. This may make the superconductive characteristics of the current limiting wire unstable.

In view of this disadvantage, the present invention provides another example of an insulating stack element 1.

Figure 3:
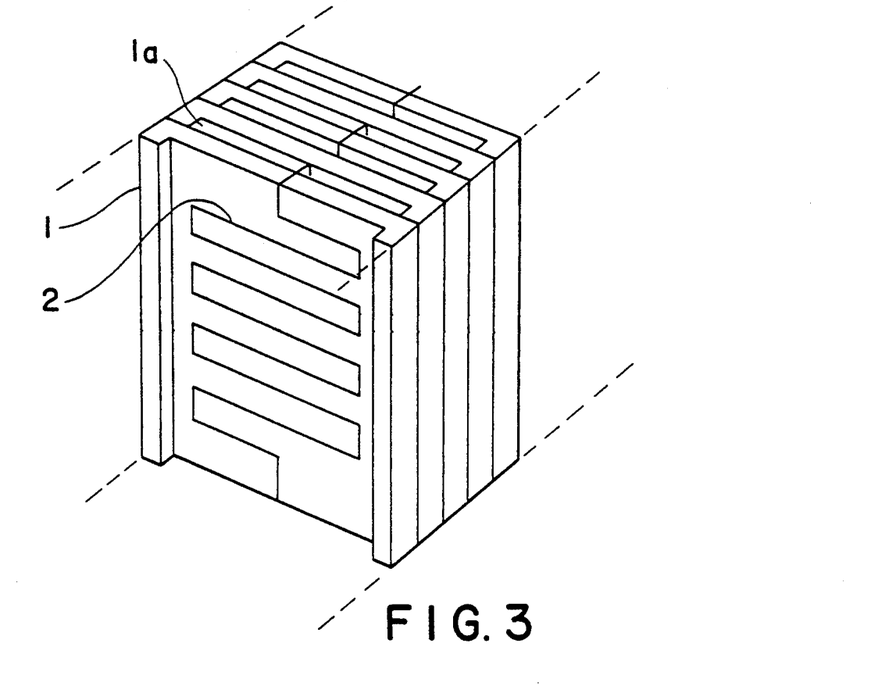
FIGS. 3 to 5 are perspective views of another examples of the stack element of FIG. 2.

With reference to FIG. 3 which is a perspective view of another example of the insulating stack element 1 which forms a current limiting element, the stack element 1 has a recess 1a. This is attained by forming a protrusion at each of the longitudinal edge portions on one side of the stack element 1. The current limiting wire 2 is provided in the recess 1a. The thus-arranged stack elements 1 are laid one on top of the other, as shown in FIG. 3, to form the current limiting element 5 shown in FIG. 1.

As is apparent from FIG. 3, when the plurality of stack elements 1 are stacked, the recesses 1a of the stack elements 1 form gaps which adjoin the surfaces on which the superconducting current limiting wires are mounted. In consequence, if this current limiting element is used to manufacture a current limiting apparatus shown in FIG. 1, liquid nitrogen flows into the gaps, cooling the entire superconducting wires sufficiently.

Figure 4:
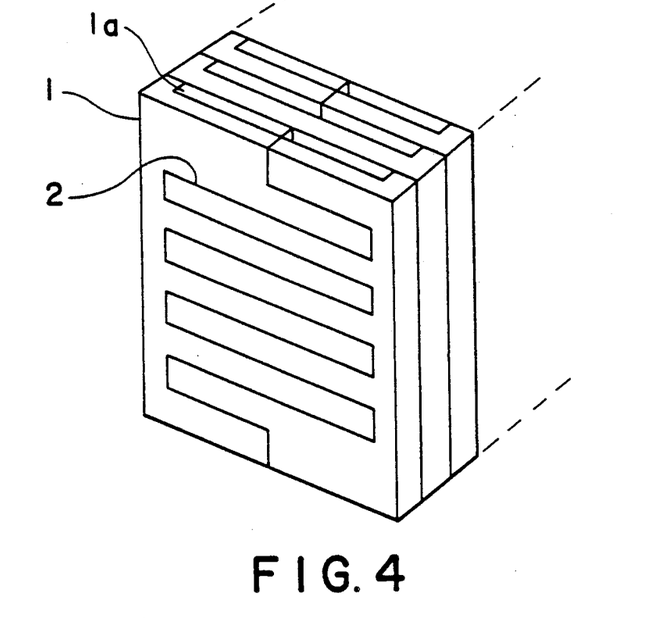

FIG. 4 shows still another example of the stack element 1. In this example, the stack element 1 has the recess 1a on the surface opposite to that on which the superconductive current limiting wire 2 is mounted. As in the example shown in FIG. 3, the liquid nitrogen can flow into the gaps in this example. As a result, the superconductive current limiting wires can be sufficiently cooled, and the superconductive characteristics thereof can be maintained stable.

Figure 5:
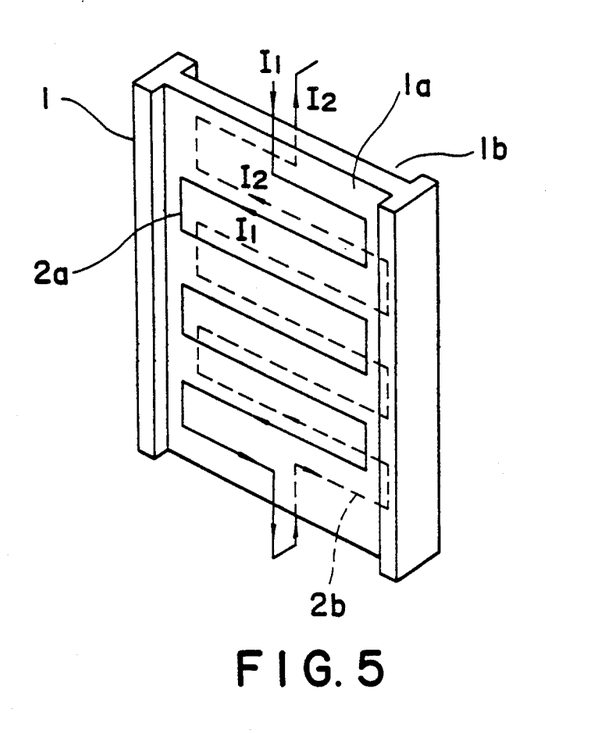

FIG. 5 shows still another example of the stack element 1.

In this example, the stack element 1 has recesses 1a and 1b on both surfaces thereof. Superconductive current limiting wires 2a and 2b are mounted on the recesses 1a and 1b, respectively. The current limiting wires 2a and 2b are connected in series, as shown in FIG. 5.

The current limiting wires are mounted on both surfaces of each of the stack elements 1 in parallel lines in which current flows in opposite directions in adjacent lines.

In this way, the length of the current limiting wire per stack can be substantially doubled when compared with that shown in FIG. 3, enabling a reduction in the number of stack elements required in a current limiting apparatus.

In a case wherein the current limiting wires are mounted on the recesses of the stack element, as shown in FIG. 5, there is the risk of the current limiting wires falling due to the electromagnetic force generated when a current flows in the wires. However, since the current limiting wires are mounted on the two surfaces of the stack element in parallel lines in which a current flows in the same direction in the opposing lines on the two surfaces, an attracting force acts between the opposing lines, preventing the falling of the current limiting wires and fixing them firmly to the surfaces of the stack element.

In a current limiting apparatus employing a current limiting element which is formed by piling the plurality of thus-arranged stack elements with the current limiting wires mounted thereon one on top of the other, liquid nitrogen can flow into the gaps in the individual stack elements, and the current limiting wires can be thereby effectively cooled.

Generally, a current limiting wire mounted on a stack element made of an insulator is formed by binding a requisite number of elongate wires so as to provide for a high resistance at the time of quenching. The present invention provides another example of a current limiting element which is intended to increase the area through which the current limiting wire of the current limiting element is in contact with the refrigerant.

Figure 6:
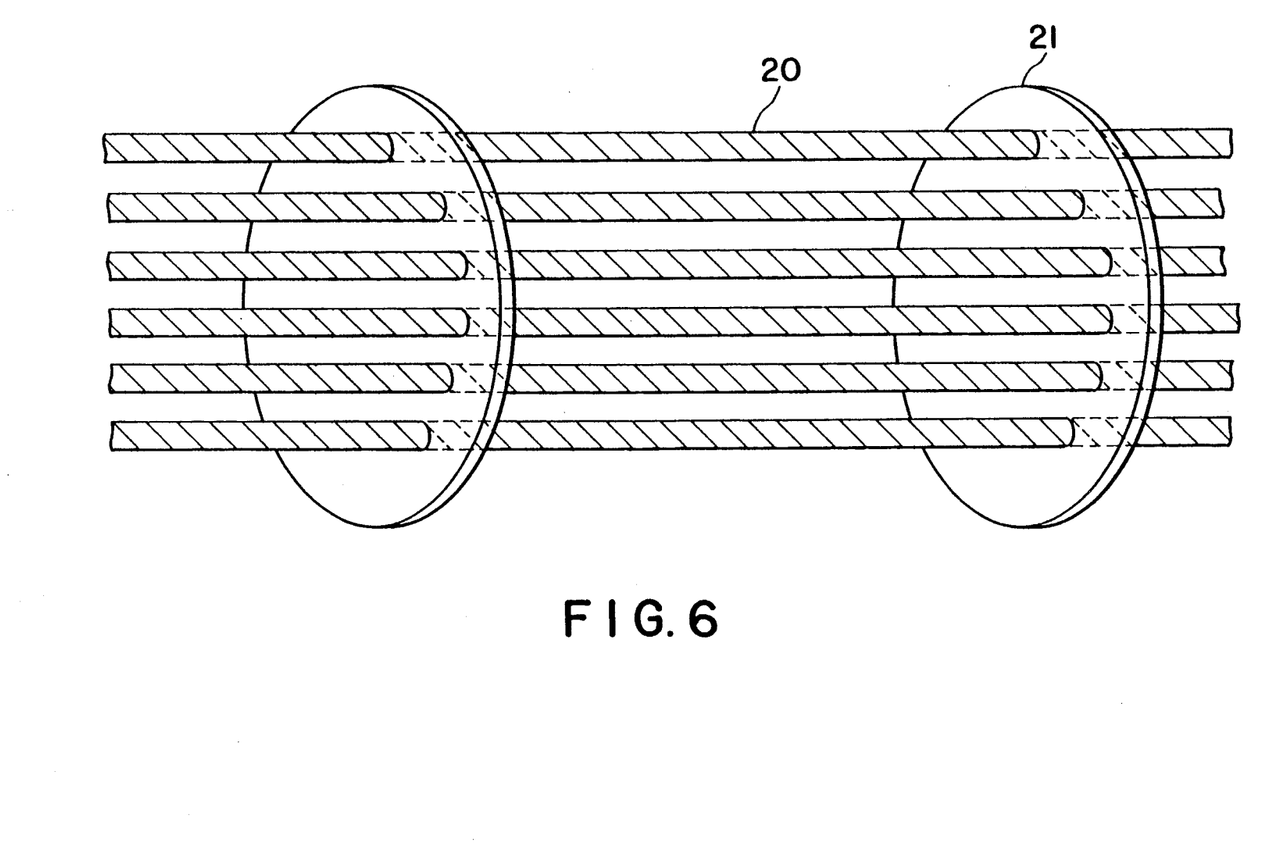
FIG. 6 shows a current limiting wire accommodated in the superconducting current limiting element.
Figure 7:
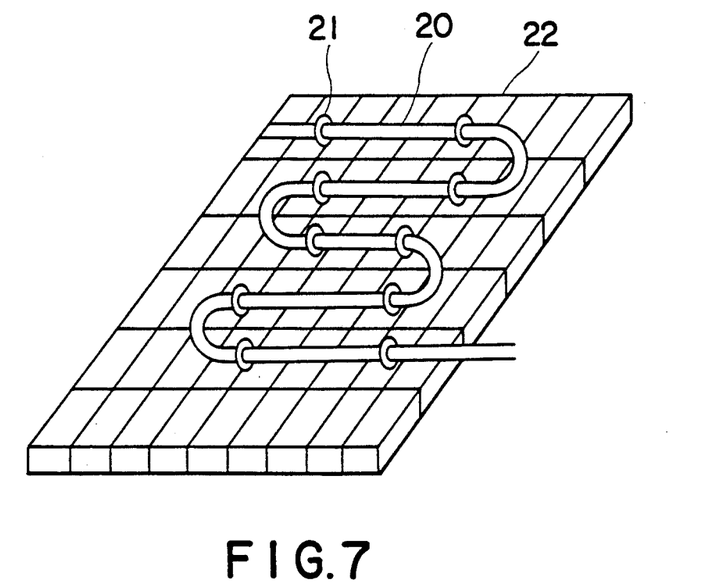
FIG. 7 is a perspective view of a substrate on which the current limiting wire of FIG. 6 is mounted.
Figure 8:
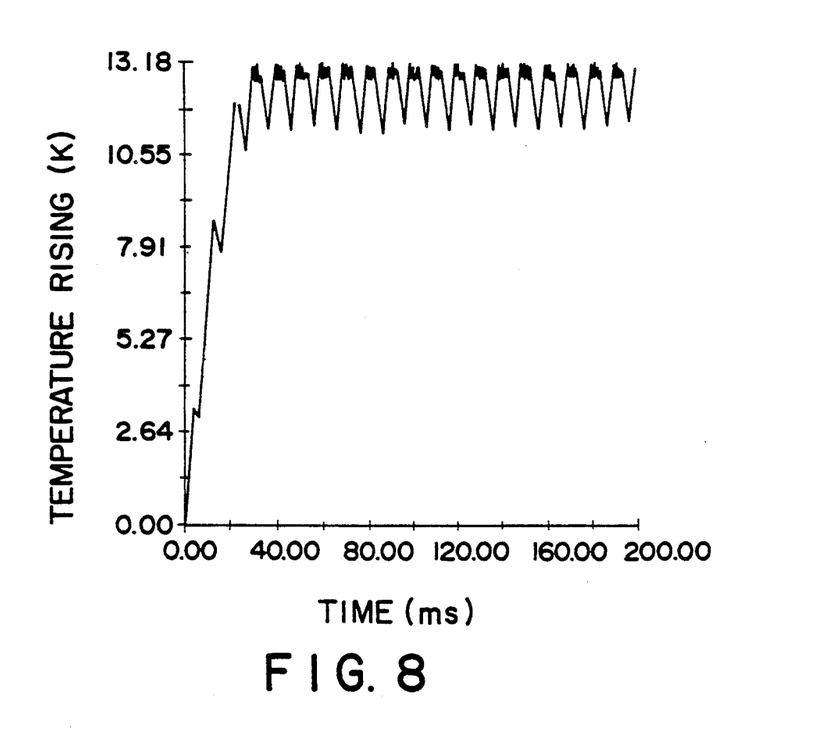
FIG. 8 shows changes in the temperature of the current limiting element which is in operation.

With reference to FIG. 6, superconductive wires 20 which form a superconducting current limiting wire are provided past a plate 21. The holes in the plate 21 are spaced apart from each other so as to allow a refrigerant to flow therebetween to cool the wires to a temperature which is sufficient to close the circuit again. The superconductive wires 20 which are spaced apart from each other at equal intervals are mounted on a substrate 22 made of an insulating material by the plates 21. The substrate 22 has a mesh-like structure so that it passes the refrigerant readily. A large number of thus-arranged substrate elements 22 are laid one on top of the other as the insulating stack elements to form a current limiting element which is to be disposed within the tank filled with liquid nitrogen, as shown in FIG. 1. Provision of such a current limiting element enables a cooling speed at which the current limiting element is cooled during the current limiting operation to be greatly improved. FIG. 8 is a graph, showing changes in the temperature of the current limiting element according to the present invention which is in operation. Joule heat and the cooling speed are balanced in a certain temperature range, and the temperature of the current limiting element is kept in that range to close the circuit again.

In the above-described embodiments, the current limiting element is composed of stack elements with a current limiting wire wound therearound in non-inductive fashion, the stack elements being laid one on top of the other. However, the object of the present invention can also be attained by provision of a superconductive current limiting element including a plurality of insulating tubes having different diameters which are disposed within a refrigerant (liquid nitrogen) tank.

Figure 9A:
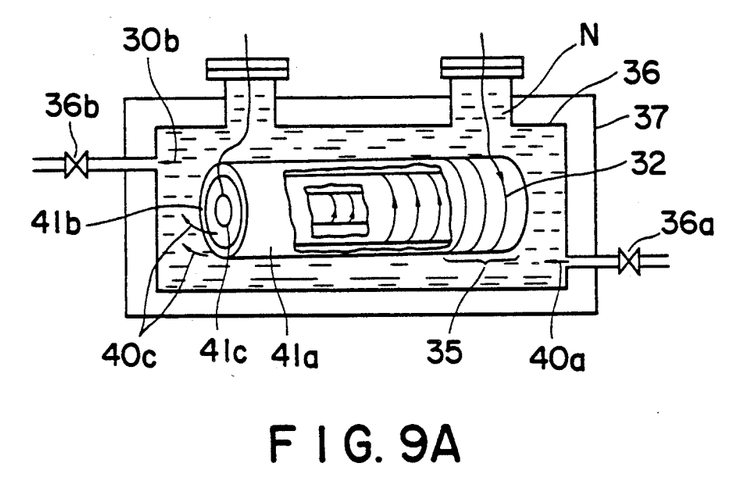
FIG. 9A is a longitudinal cross-sectional view of a superconducting current limiting apparatus, showing a second embodiment of the present invention.
Figure 9B:
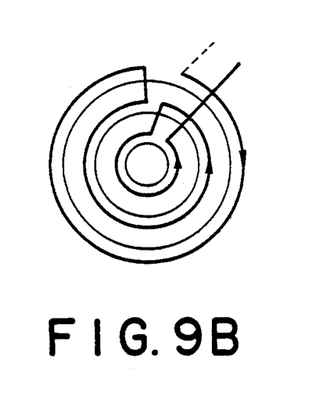
FIGS. 9B and 9C show the flow of current in the current limiting wire wound around an insulating tube of the superconducting current limiting apparatus of FIG. 9A.
Figure 9C:
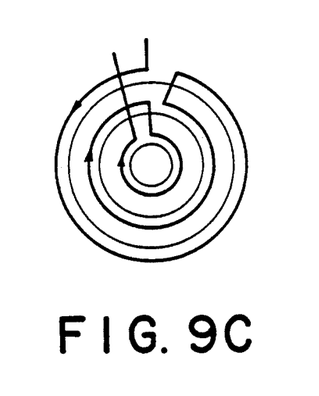

FIG. 9 shows an example of such a current limiting element. Within a tank 36 filled with liquid nitrogen N, insulating tubes 31a, 31b, 31c are coaxially disposed in the longitudinal direction of the tank. The diameters of the insulating tubes are set to 31a>31b>31c. A superconductive current limiting wire 32 is wound around the outer periphery of each of the insulating tubes 31a, 31b, 31c. As is shown in FIGS. 9B and 9C, the wire is wound around the two insulating tubes 31b and 31c having smaller diameters in the direction opposite to that in which it is wound around the insulating tube having the maximum diameter.

The tank 6 filled with liquid nitrogen A has at two lateral ends a liquid nitrogen supply valve 36a and a discharge valve 36b, as shown in FIG. 9A. The liquid nitrogen A flows within the tank 36 in the directions indicated by the arrows 40a, 40b and 40c. Since other structure is the same as that of the current limiting element shown in FIG. 1, description thereof is omitted.

In the embodiment shown in FIG. 9, the liquid nitrogen which is supplied through the supply valve 36a flows not only along the surface of the insulating tube 31a having the maximum diameter but also in the gaps between the insulating tubes 31a, 31b, and 31c, cooling all the superconductive wires to a sufficient extent.

Further, the magnetic field generated by the current that flows in the superconductive current limiting wire wound around the tube (a coil) having the maximum diameter cancels the magnetic fields generated by the currents that flow in the superconductive current limiting wires on the tubes having smaller diameters, substantially no current is induced. This enables the current limiting wires to exhibit stable superconductive characteristics when a current flows in a circuit or a system which employs a current limiting apparatus.

In the above-described embodiments, when the current that flows in a circuit or a system exceeds the critical current value of the superconductor, the superconductor quenches and becomes a resistor. The resistor generates heat when a current flows therein, making the liquid nitrogen N evaporate. Generally, when a short-circuit occurs, a circuit breaker operates instantaneously to interrupt the short circuit current, and the rate at which the liquid nitrogen evaporates is therefore within the blow-off capacity of a safety valve. However, if the circuit breaker fails to operate, liquid nitrogen N rapidly evaporates to generate a large amount of vapors. When nitrogen evaporates, its volume increases by a factor of about 1500, causing a risk of explosion of the apparatus.

In order to cope with this situation, the present invention provides the following embodiment.

Figure 10:
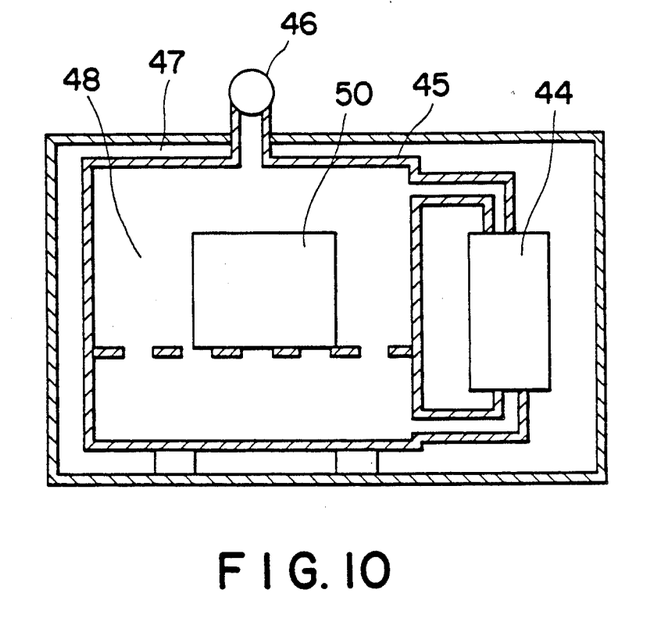
FIGS. 10 and 11 are vertical cross-sectional views of the superconducting current limiting apparatus according to the present invention, showing how the current limiting element accommodated in the current limiting apparatus is cooled by a refrigerant.

Referring to FIG. 10 which is a cross-sectional view of a superconductive current limiting apparatus according to the present invention, a superconductor 50 is accommodated within a refrigerant tank 45. The superconductor 50 may comprise a current limiting element shown in FIG. 1 which is composed of stack elements or the one shown in FIG. 9 which employs insulating tubes. The tank 45 has a cooler 44 which supplies a gas 48 having a temperature below the critical temperature of the superconductor 50 into the tank 45 so as to cool the superconductor. In order to improve a cooling efficiency, it is preferable for hydrogen having a high thermal conductivity to be used as a gaseous refrigerant 48. However, nitrogen may also be used. In this embodiment, since no heat is generated from the superconductor 50 in a normal operation, the superconductor is maintained to a superconducting state. However, when a short-circuit is established and a current that flows in the superconductor 50 exceeds the critical current thereof, the superconductor 50 quenches and becomes a resistor. The temperature of the superconductor 50 may rise beyond the critical temperature due to heat generated. However, it is cooled by the gaseous refrigerant 48 having a temperature below the critical temperature after the short-circuit current has been limited, and returns to a superconducting state. Further, since liquid nitrogen which increases its volume greatly when it evaporates is not used, even if the circuit breaker fails to limit the short circuit current, direct heating of liquid nitrogen can be avoided, precluding explosive evaporation thereof. In this case, the superconductor 50 may be burned by the short circuit current. However, the damage caused by this is far smaller than that done by an explosion caused by an instantaneous evaporation of liquid nitrogen.

In this embodiment, it is essential to keep the temperature of the gaseous refrigerant 48 below the critical temperature. However, if the cooler fails, the temperature of the gas 48 rises rapidly, rendering the superconductor to a normal state. Therefore, the temperature of the gaseous refrigerant 48 must be kept below the critical temperature of the superconductor 50 for a while until the cooler is restored. This may be achieved by the use of a substance which exists in liquid at a temperature below the critical temperature of the superconductor 50, such as liquid nitrogen, for the purpose of cooling the gaseous refrigerant 48. Evaporation of liquid nitrogen requires a large amount of heat, and this enables the temperature of the refrigerant to be kept below the critical temperature for a longer period of time when compared with the case in which only gaseous refrigerant is used.

Figure 11:
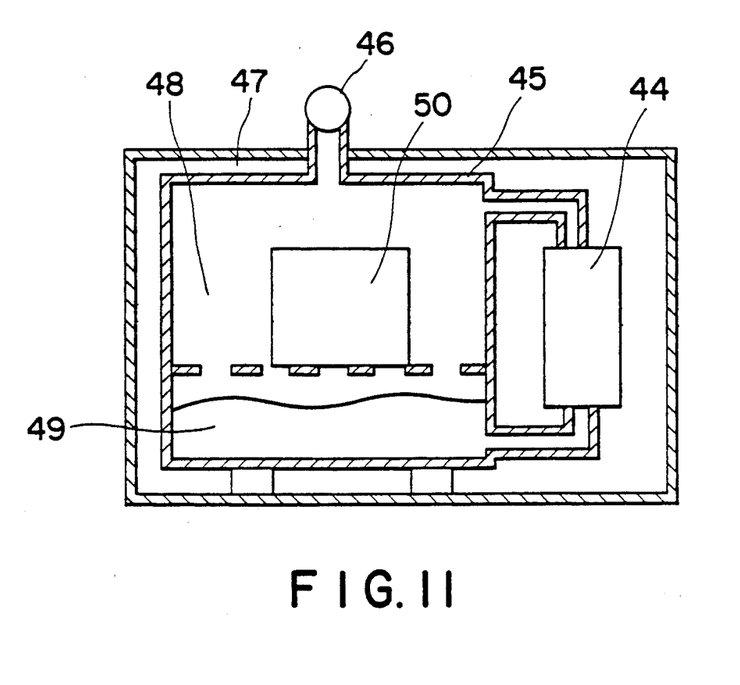

FIG. 11 shows an embodiment which employs a liquid 49 that exits in liquid at a temperature below the critical temperature of the superconductor 50 to cool the gaseous refrigerant 48. In the embodiment shown in FIG. 11, the gaseous refrigerant 48 for cooling the superconductor 50 is in contact with the liquid which exits in liquid at a temperature below the critical temperature of the superconductor 50. Both of the gaseous refrigerant 48 and liquid 49 have the substantially same temperature. The gaseous refrigerant 48 and the liquid 49 may be the same substance such as nitrogen, or they may be hydrogen and nitrogen, respectively.

In this embodiment, when the level of liquid 49 lowers to a predetermined value or less, when the temperature of the gaseous refrigerant rises to a predetermined value or above, when the pressure in the container 45 rises to a predetermined value or above, or when the superconductor 50 is rendered to a normal conducting state, the cooler begins to operate to cool both of the gaseous refrigerant 48 and the liquid 49. When a short circuit occurs and the current that flows in the superconductor 50 exceeds the critical current thereof, the suerconductor 50 quenches, and becomes a resistor, generating heat. If the circuit breaker fails to interrupt the short circuit current, heat generation lasts for a long time, raising the temperature of the gaseous refrigerant 48. However, the heat is transmitted to the liquid 49 at a slow speed, and an explosive evaporation of the liquid 49 can be precluded.

Figure 12:
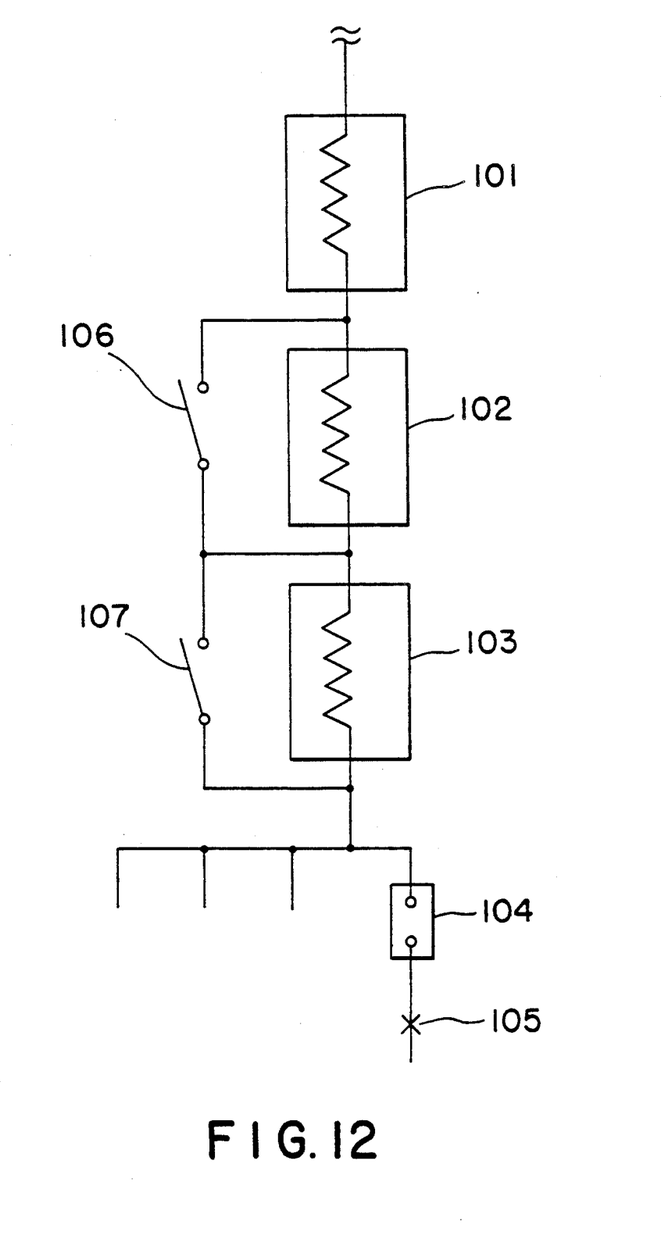
FIG. 12 is a circuit diagram of a short ciruit current limiting superconducting apparatus to which the superconducting current limiting apparatus according to the present invention is applied.

FIG. 12 shows a power supply line to which the superconducting current limiting apparatus according to the present invention can be applied. The example to be described below employs three superconducting apparatus units. However, the number of units is not limited to this.

The critical current values $I_{c1}$, $I_{c2}$, and $I_{c3}$ of the units 101 to 103 are set to values which satisfy $I_{c1} > I_{c2} > I_{c3}$. Closing devices 106 and 107 are parallel-connected to the units 102 and 103, respectively. A small capacity circuit breaker 104 having an interrpting current which is above $I_{c2}$ is connected in series with the unit 103. A reference numeral 105 indicates a point where a short-circuit occurs.

When a short-circuit occurs at the point 105 and the short circuit current rises to $I_{c3}$, the unit 103 quenches, and limits the current to this value. Next, the small capacity circuit breaker 104 operates to break off the short circuited point 105, and the closing device 107 is then closed to make the current bypass the unit 103 and thereby complete a circuit reclosing operation.

Thereafter, the refrigerant is supplemented in the unit 103. When the temperature thereof drops to a predetermined value due to supply of refrigerant, the unit 103 returns to a superconducting state. The closing device 107 is then opened to return the system to its original state.

If another short-circuiting occurs during the restoration of the unit 103, the unit 102 and the closing device 106 are operated in the manner described above to reclose the circuit. In other words, the number of units is determined by the frequency of a service interruption to be controlled.

What is claimed is:

1. A non-inductive superconducting current limiting apparatus, comprising:
    a first container;
    a superconducting current limiting element accommodated in said first container and comprising a stack of stack elements;
    a superconducting current limiting wire accommodated in each of said stack elements;
    a refrigerant filling said first container for cooling said superconducting current limiting element;
    a second container for accommodating said first container with a gap in such a manner that said first container is heat insulted; and
    a conductor means for connecting said superconducting current limiting element to an external power supply system;
    said superconductive current limiting wire exhibiting an increase in resistance when a current in said superconductive current limiting wire exceeds a known value, wherein the superconducting current limiting wires of the stack elements are connected in series, said superconducting current limiting wire being arranged in each of the stack elements in a meandering manner so that magnetic fluxes generated by currents that flow in adjacent parts of the superconducting current limiting wire in each struck element are canceled to create a non-inductive state.

2. A superconducting current limiting apparatus according to claim 1, wherein said stack elements are laid one on top of the other in such a manner that a passageway for a refrigerant is formed between adjacent stack elements.

3. A superconducting current limiting apparatus according to claim 1, wherein each of said stack elements has a recess on at least one surface thereof.

4. A superconducting current limiting apparatus according to claim 3, wherein each of said stack elements has a recess on the surface thereof on which said current limiting wire is mounted.

5. A superconducting current limiting apparatus according to claim 3, wherein each of said stack elements has a recess on the surface thereof which is opposite to that on which said current limiting wire is mounted.

6. A superconducting current limiting apparatus according to claim 3, wherein each of said stack elements has recesses on both surfaces thereof.

7. A superconducting current limiting apparatus according to claim 1, wherein said gap between said first container and said second container is filled with a heat insulating material.

8. A superconducting current limiting apparatus according to claim 1, wherein said gap between said first container and said second container is evacuated to form a vacuum.

9. A superconducting current limiting apparatus according to claim 1, wherein said refrigerant is liquid nitrogen.

10. A superconducting current limiting apparatus according to claim 1, wherein said refrigerant is a gas having a temerature below a critical temperature of said superconducting current limiting element.

11. A superconducting current limiting apparatus according to claim 1, wherein said refrigerant comprises liquid nitrogen and a gas having a temperature below the critical temperature of said superconducting current limiting element.

12. A superconducting current limiting apparatus according to claim 1, wherein said current limiting wire accommodated in each of said, stack elements comprises a plurality of current limiting wire elements which are spaced apart from each other at equal intervals.

13. A superconducting current limiting apparatus according to claim 12, wherein each of said stack elements comprises an insulating material having a mesh structure.

14. A superconducting current limiting apparatus according to claim 1, further comprising a cooler for cooling said refrigerant.

15. A non-inductive superconducting current limiting apparatus comprising:
a first container having opposing wall structure;
a superconducting current limiting element accommodated in said first container;
a refrigerant filling said first container for cooling said superconducting current limiting element;
a second container for accommodating said first container with a gap in such a manner that said first container is heat insulted;
a conductor means for connecting said superconducting current limiting element to an external power supply system; and
means for circulating the refrigerant in said first container, said circulating means comprising inlet and outlet ports formed in the opposing walls of the first container;
said superconductive current limiting element comprising a first insulating tube means around which a first superconducting current limiting wire is wound, and around which a second superconducting current limiting wire is wound, said second current limiting wire being wound in such a manner that a magnetic flux generated by a current that flows in said first current limiting wire is canceled by a magnetic flux generated by a current that flows in said second current limiting wire, said first and second insulating tubes being arranged so that the space formed therebetween accords with a circulation direction of the refrigerant from the inlet port towards the outlet port.

16. A superconducting current limiting apparatus according to claim 15, wherein said second insulating tube means comprises an outer insulating tube and an inner insulating tube which is disposed coaxially with respect to said outer insulating tube, said second superconducting current limiting wire being wound around the outer peripheries of said outer and inner insulating tubes in such a manner that the magnetic flux generated by a current that flows in said first superconducting current limiting wire wound around said first insulating tube means is cancelled by a magnetic flux generated by a current that flows in said second superconducting current limiting wire wound around said outer peripheries of said outer and inner insulating tubes.

* * * * *

UNITED STATES PATENT AND TRADEMARK OFFICE
CERTIFICATE OF CORRECTION

PATENT NO. : 4,994,932

DATED : February 19, 1991

INVENTOR(S) : Masaru Okamoto et al.

It is certified that error appears in the above-identified patent and that said Letters Patent is hereby corrected as shown below:

On the tile page, item [75] Inventors:
The last inventor's city of residence is incorrect, should be, Tsutomu Fujioka --Tokyo--.

Signed and Sealed this

Eighth Day of September, 1992

*Attest:*

DOUGLAS B. COMER

*Attesting Officer*     *Acting Commissioner of Patents and Trademarks*